United States Patent
Hong et al.

(10) Patent No.: US 8,628,999 B2
(45) Date of Patent: Jan. 14, 2014

(54) SOLAR CELL MADE IN A SINGLE PROCESSING CHAMBER

(75) Inventors: Augustin J. Hong, White Plains, NY (US); Marinus J. Hopstaken, Carmel, NY (US); Chien-Chih Huang, Pingtung (TW); Yu-Wei Huang, Tainan (TW); Jeehwan Kim, Los Angeles, CA (US); Devendra K. Sadana, Pleasantville, NY (US); Chih-Fu Tseng, Tainan (TW)

(73) Assignees: International Business Machines Corporation, Armonk, NY (US); Bay Zu Precision Co., Ltd., Tainan (TW)

( * ) Notice: Subject to any disclaimer, the term of this patent is extended or adjusted under 35 U.S.C. 154(b) by 16 days.

(21) Appl. No.: 13/406,838

(22) Filed: Feb. 28, 2012

(65) Prior Publication Data

US 2013/0224900 A1    Aug. 29, 2013

(51) Int. Cl.
  *H01L 31/00*    (2006.01)
(52) U.S. Cl.
  USPC ................ 438/96; 438/97; 136/255; 136/258

(58) Field of Classification Search
  None
  See application file for complete search history.

(56) References Cited

U.S. PATENT DOCUMENTS

2011/0088760 A1 *  4/2011  Sheng et al. .................. 136/255

OTHER PUBLICATIONS

Ballutaud, J., et al. "Reduction of the Boron Cross-Contamination for Plasma Deposition of P-I-N Devices in a Single-Chamber Large Area Radio-Frequency Reactor" Thin Solid Films, vol. 468, Issues 1-2. Dec. 2004. pp. 222-225.

* cited by examiner

*Primary Examiner* — Zandra Smith
*Assistant Examiner* — Pamela E Perkins
(74) *Attorney, Agent, or Firm* — Tutunjian & Bitetto, P.C.; Louis J. Percello

(57) ABSTRACT

Methods for forming a photovoltaic device include depositing a p-type layer on a substrate and cleaning the p-type layer by exposing a surface of the p-type layer to a plasma treatment to react with contaminants. An intrinsic layer is formed on the p-type layer, and an n-type layer is formed on the intrinsic layer.

20 Claims, 7 Drawing Sheets

SOLAR CELL MADE IN A SINGLE PROCESSING CHAMBER

BACKGROUND

1. Technical Field

The present invention relates to solar cells, and more particularly to devices and methods which employ a single chamber process for fabricating photovoltaic devices.

2. Description of the Related Art

Fabrication of amorphous hydrogenated silicon (a-Si:H) solar cells is performed in a multi-chamber cluster tool. Constituent active layers in such devices include a p-type layer (or p-layer), an intrinsic layer (or i-layer) and an n-type layer (or n-layer), collectively a p-i-n or pin stack. The p, i and n (e.g., a-Si:H) layers are deposited in separate chambers, which results in reduced manufacturing efficiency.

In some processes, a same chamber is reconfigured for the deposition of each new layer. Solar cell fabrication using the single chamber suffers from drawbacks. For example, when diborane is used for a p-type dopant source (e.g., boron), boron is left over in the chamber. This results in a higher probability of the p-i interface being contaminated, resulting in poor device performance.

In another example, when trimethylborane (TMB) is used for a p-type dopant source, less boron is left over. However, for materials, e.g., a-Ge:H, a-Si:H, etc., it is extremely difficult to provide boron to these films without contaminating reactants being present (the process is not flexible for all device materials). TMB is also an order of magnitude more expensive than diborane doping, and unintentional carbon doping often occurs resulting in poor doping activation.

SUMMARY

A method for forming a photovoltaic device includes depositing a p-type layer on a substrate and cleaning the p-type layer by exposing a surface of the p-type layer to a plasma treatment (or gas flow) in the chamber to react with contaminants. An intrinsic layer is formed on the p-type layer, and an n-type layer is formed on the intrinsic layer.

Another method for forming a photovoltaic device includes depositing a p-type layer on a substrate; partially forming an intrinsic layer on the p-type layer; cleaning a partially formed intrinsic layer by exposing a surface of the partially formed intrinsic layer to a plasma treatment to react with contaminants; completing the intrinsic layer on the p-type layer; and forming an n-type layer on the intrinsic layer.

Yet another method for forming a photovoltaic device includes depositing a p-type layer on a substrate using diborane as a dopant gas; cleaning the p-type layer by a plasma treatment to react with and remove contaminants; completing an intrinsic layer on the p-type layer; and forming an n-type layer on the intrinsic layer, wherein all steps are performed in a single processing chamber.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
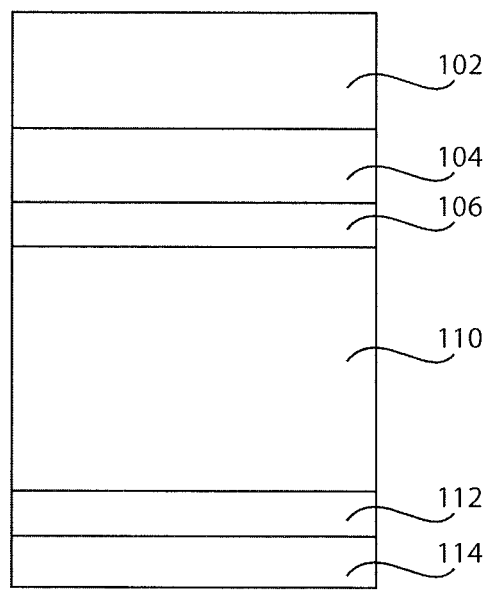
FIG. 1 is a cross-sectional view of a photovoltaic device with a cleaned p-i interface in accordance with the present principles.

In accordance with the present principles, devices and methods are provided that result in improved device efficiency and performance. Photovoltaic devices, such as solar cells and the like employ active layers that may include a p-type layer (or p-layer), an intrinsic layer (or i-layer) and an n-type layer (or n-layer), collectively a p-i-n or pin stack. Contaminants between the layers can result in reduced device efficiency. This is especially the case at an interface between the p-layer and the i-layer (p-i interface). The present principles provide methods for cleaning the devices and/or the chamber to reduce or eliminate contaminants that appear at interfaces between layers of the device.

In one embodiment, the p-type layer is formed by a deposition process in a processing chamber on a device or sample. The sample remains loaded in the chamber and subjected to the cleaning process or processes. For example, an in-situ cleaning of the chamber is performed without damaging the p-type layer. In useful embodiments, the cleaning process may include a low power $NF_3$ plasma cleaning, an $NF_3$ gas flow and/or an $NH_3$ pump/purge. The chamber is cleaned to remove any remaining p-type compounds. The processing preferably continues without removing the device/sample. This provides a single chamber process for multiple layer processing.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case, the device/chip may be mounted in a single chip package (such as a plastic carrier, with leads that are affixed to a motherboard or other higher level carrier) or in a multichip package (such as a ceramic carrier that has either or both surface interconnections or buried interconnections).

In any case, the devices/chips may be integrated with other chips, discrete circuit elements, and/or other signal processing devices as part of either (a) an intermediate product, such as a motherboard, or (b) an end product. The end product can be any product that includes photovoltaic devices, ranging from toys, energy collectors, solar devices and other applications including computer products or devices having a display, a keyboard or other input device, and a central processor. The present embodiments may be part of a photovoltaic device or circuit, an integrated circuit chip, a solar cell, a light sensitive device, etc.

Referring now to the drawings in which like numerals represent the same or similar elements and initially to FIG. 1, an illustrative photovoltaic structure 100 is illustratively depicted in accordance with one embodiment. The photovoltaic structure 100 may be employed in solar cells, light sensors or other photovoltaic applications. Structure 100 includes a substrate 102 that permits a high transmittance of light. The substrate 102 may include a transparent material, such as glass, a polymer, etc. or combinations thereof.

A first electrode 104 includes a transparent conductive material. Electrode 104 may include a transparent conductive oxide (TCO), such as, e.g., a fluorine-doped tin oxide ($SnO_2$: F, or "FTO"), doped zinc oxide (e.g., ZnO:Al), indium tin oxide (ITO) or other suitable materials. For the present example, a doped zinc oxide is illustratively employed for electrode 104. The TCO 104 permits light to pass through to an active light-absorbing material beneath and allows conduction to transport photo-generated charge carriers away from that light-absorbing material. The TCO 104 may be deposited by a chemical vapor deposition (CVD) process, low pressure CVD (LPCVD) process or a plasma-enhanced CVD (PECVD) process.

The light-absorbing material includes a doped p-type layer 106 (e.g., a doped amorphous silicon (a-Si), a doped amorphous silicon carbide, microcrystalline silicon (μc-Si) layer, etc.). In this illustrative structure 100, layer 106 is formed on electrode 104. In one embodiment, p-type layer 106 includes boron as a dopant, although other p-type dopants may be employed. Layer 106 may be deposited by a chemical vapor deposition (CVD) process, or a plasma-enhanced CVD (PECVD) process, preferably using diborane gas. The p-type layer 106 may have a thickness of between about 5-20 nm. In particularly useful embodiments, layer 106 may include amorphous SiC, amorphous Si and microcrystalline Si.

The p-type layer 106 is preferably doped using diborane ($B_2H_6$), which is an inexpensive process for doping the p-type layer 106 with boron. Diborane generates contaminating species that are left behind in the chamber and may be present during the formation of an intrinsic layer 110. The contaminants can result in the disruption of charge flow and hence negatively affect the device's efficiency. In accordance with the present principles, the intrinsic layer 110 can be protected from contamination species by employing an in-situ cleaning process.

In one embodiment, the device 100 is left in the chamber for the entire formation of the pin stack (e.g., p-type layer 106, intrinsic layer 110 and an n-type layer 112). The single chamber process can be realized (e.g., without using TMB) by p-type doping with diborane ($B_2H_6$) and an in-situ cleaning of the chamber without damaging the p-type layer 106. In one embodiment, this is achieved by a low power plasma cleaning (e.g., using $NF_3$, $CF_4$, $SF_6$ or other gases and in particular fluorine-based gases), a gas flow through the chamber (e.g., using $NF_3$, $CF_4$, $SF_6$ or other gases and in particular fluorine-based gases), an ammonia ($NH_3$) pump or purge or combinations of such processes. Combinations of these cleaning processes may be employed concurrently or in different sequences.

For the $NF_3$ plasma in-situ clean and other processes, adjustments to chamber conditions are made for the cleaning process. A thickness of the p-type layer 106 needs to be substantially maintained and not etched away by the plasma treatment. For example, in a high power $NF_3$ plasma clean, the p-type layer is etched away. The high power may be about 4 $W/cm^2$ of greater. For a low power $NF_3$ plasma clean, the p-type layer 106 is not etched maintaining a same thickness for the p-type layer 106 after the process. The low power may be maintained at about 0.6 $W/cm^2$ for 30 sec to provide cleaning a surface of the p-type layer 106 without etching away the p-type layer 106, e.g., the thickness of the layer 106 is maintained. Other powers and cleaning times may be employed to achieve the same or similar results.

For the fluorine-based gas flow of the $NH_3$ pump or purge, the chamber is exposed to the cleaning gas, which is pumped through the equipment, e.g., the chamber, feed lines, etc., to remove remnants or contaminates (e.g., boron) from the chamber. The gas flow, low power $NF_3$, and/or $NH_3$ pump/purge are effective at cleaning diborane in the chamber. The cleaning processes result in a maintaining a comparable FF to that which could be achieved by an ex-situ clean (cleaning the chamber by removing the samples or device first).

Processing continues in the cleaned chamber with the intrinsic layer 110 of compatible material being formed on layer 106. Intrinsic layer 110 may be undoped and may include an amorphous silicon material, e.g., hydrogenated amorphous Si (a-Si:H). The intrinsic layer 110 may include a thickness of between about 100-300 nm, although other thicknesses are contemplated. The intrinsic layer 110 may be deposited by a chemical vapor deposition (CVD) process, or a plasma-enhanced CVD (PECVD) process using silane gas and hydrogen gas.

A doped layer 112 (e.g., an n-type layer) is formed on the intrinsic layer 110. Layer 112 may include an n-type hydrogenated microcrystalline (μc-Si:H) or a-Si layer. Layer 112 may be deposited by a chemical vapor deposition (CVD) process, or a plasma-enhanced CVD (PECVD) process. The n-type layer 112 may have a thickness of between about 5-20 nm. A back reflector and/or bottom electrode 114 may be formed by a reflective metal, such as Ag, Al, Au, etc. A suitable metal deposition process may be employed, e.g., physical or chemical vapor deposition, sputtering, electro or electroless plating, etc. It should be understood that other material selections, layers, structures, etc. may be employed in device 100.

In one embodiment, the cleaning process(es) is/are delayed until after the intrinsic layer 110 has been initiated. For example, the intrinsic layer 110 may be initiated and grown from about 1 nm to about 15 nm. Then, a cleaning process is performed in the same chamber as described above. This results in an improved FF and $V_{oc}$ over no in-situ cleaning and over cleaning after the formation of the p-type layer 106. In this way, the normally ultra-thin p-type layer (e.g., 5-20 nm in thickness) is protecting from etching by plasma treatment and a good interface is achieved between the p-type layer 106 and intrinsic layer 110.

The following FIGS. will present illustrative experimental results for devices fabricated using the cleaning processes as described herein. It should be noted that a solar cell may be described in terms of a fill factor (FF). FF is a ratio of the maximum power point ($P_m$) divided by open circuit voltage ($V_{oc}$) and short circuit current ($J_{sc}$):

$$FF = \frac{P_m}{V_{oc}J_{sc}}.$$

A higher open circuit voltage provides greater efficiency, if other parameters remain the same. Increased efficiency of photovoltaic devices even by a portion of one percent is of utmost importance in the present energy environment.

Figure 2:
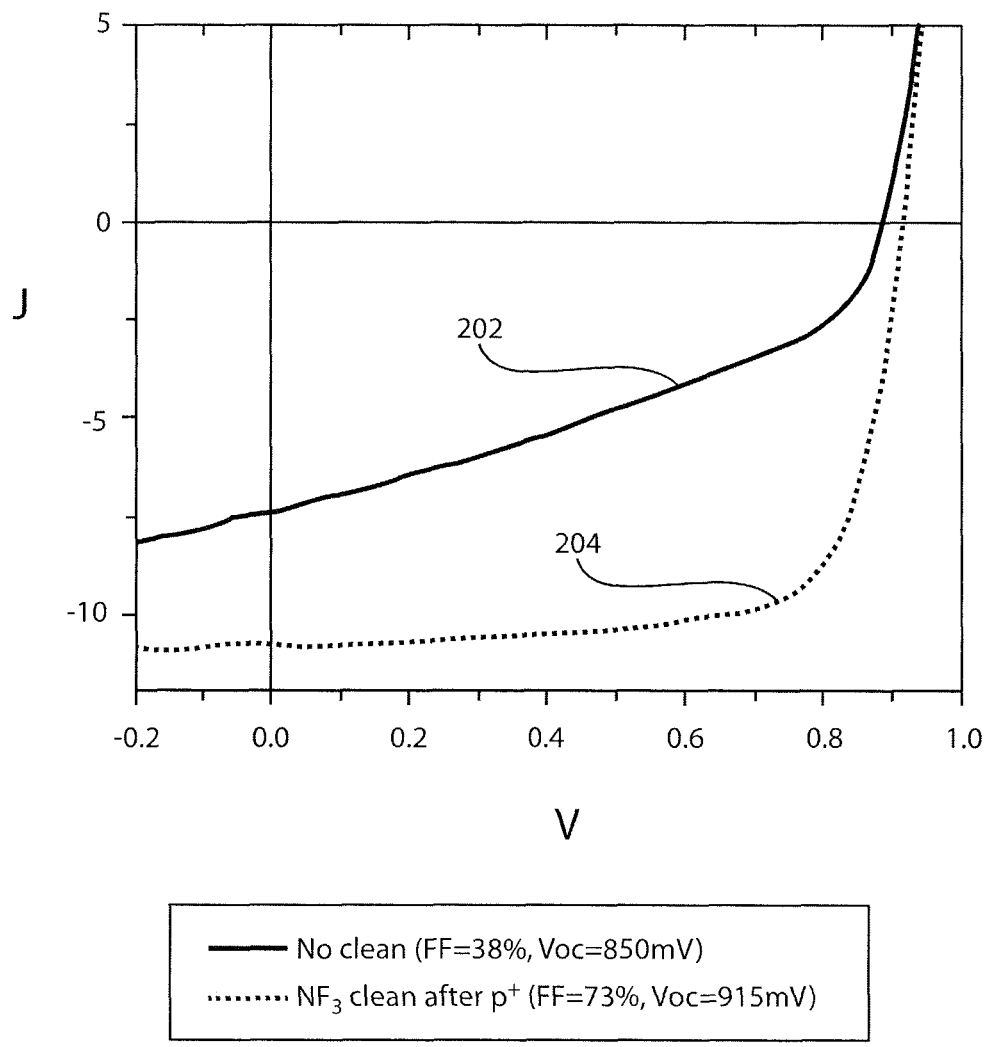
FIG. 2 depicts plots showing current density (J) (mA/cm$^2$) versus voltage (V) (volts) for photovoltaic devices with an ex-situ $NF_3$ plasma clean and without a clean in accordance with the present principles.

Referring to FIG. 2, plots of current density (J) (mA/cm$^2$) versus voltage (V) (volts) for devices with and without a clean process are illustratively shown. Plot 202 shows a J-V curve for an amorphous Si device with a pin stack formed without the use of a cleaning step between the p-type layer and the intrinsic layer. The device includes a FF of 38% and a $V_{oc}$ of 850 mV. Plot 204 shows a J-V curve for an amorphous Si device with a pin stack formed with the use of a NF$_3$ ex-situ cleaning step between the p-type layer and the intrinsic layer. The process for forming the device of plot 204 includes p-type lyer deposition followed by an unloading of the device/substrate from a processing chamber, cleaning the chamber with NF$_3$ gas and reloading the substrate/device for the formation of the intrinsic layer and the n-type layer. The plot 204 demonstrates an improvement in the FF to 73% and the $V_{oc}$ to 915 mV.

The improvement of FF and $V_{oc}$ can be attributed to the removal of contaminates that would otherwise exist at the p-i interface of the device. While the improvement is notable, one drawback includes having to remove the sample/device from the chamber.

Figure 3:
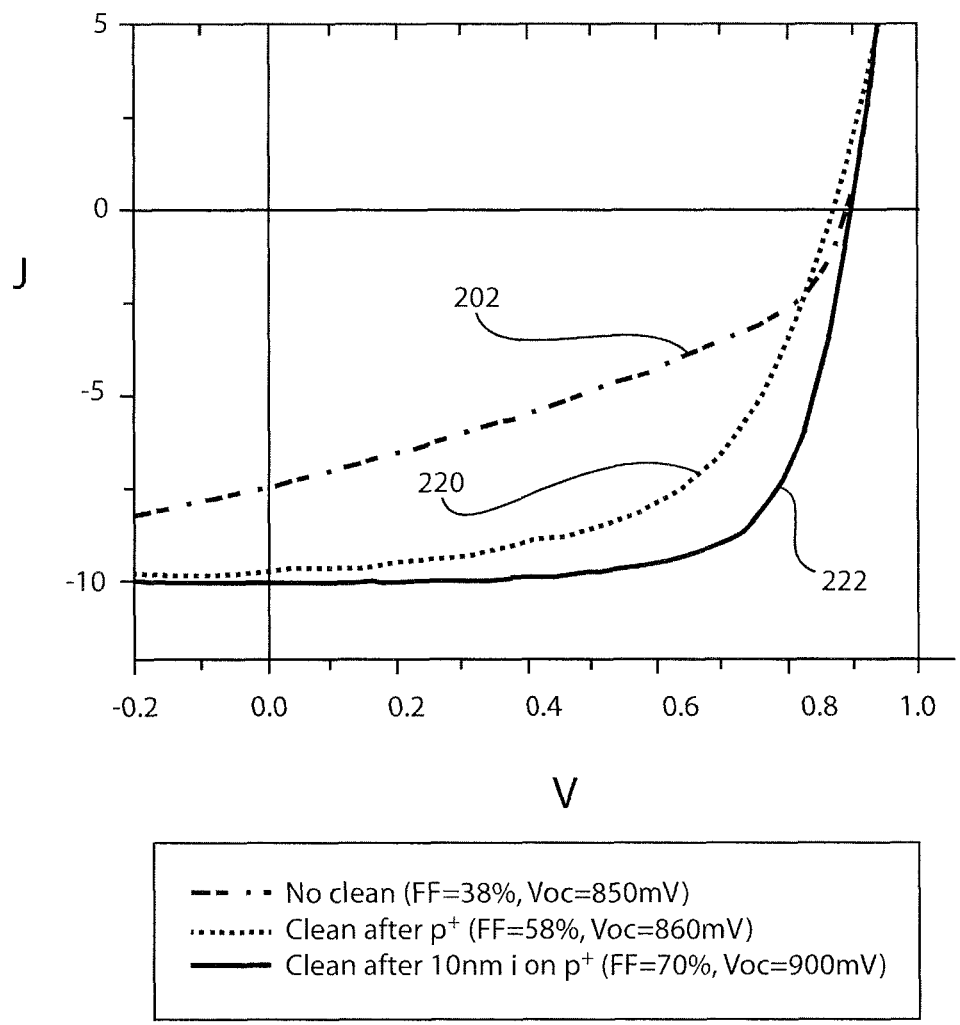
FIG. 3 depicts plots showing current density (J) (mA/cm$^2$) versus voltage (V) (volts) for photovoltaic devices without a clean, with an in-situ $NF_3$ plasma treatment and with an in-situ $NF_3$ plasma treatment on a partially formed intrinsic layer in accordance with the present principles.

Referring to FIG. 3, plots of current density (J) (mA/cm$^2$) versus voltage (V) (volts) for devices with and without a clean process are illustratively shown. Plot 202 shows the J-V curve as depicted in FIG. 2 with FF=38% and $V_{oc}$=850 mV for reference. Plot 220 shows a J-V curve for an amorphous Si device with a pin stack formed with the use of a NF$_3$ plasma cleaning step on the p-type layer. The process for forming the device of plot 220 includes p-type layer deposition followed by an in-situ NF$_3$ plasma cleaning step in the same processing chamber. The NF$_3$ plasma cleaning step in this embodiment had a duration of about 30 seconds at low power (about 0.6 W/cm$^2$). In this way, the contaminants on the surface of the p-type layer could be removed without losing the thickness of the p-type layer due to etching. The cleaning step is followed by the formation of the intrinsic layer and the n-type layer. The plot 220 demonstrates an improvement in the FF to 58% and the $V_{oc}$ to 860 mV.

Plot 222 shows a J-V curve for an amorphous Si device with a pin stack formed with the use of the NF$_3$ plasma cleaning step on the p-type layer. The process for forming the device of plot 222 includes p-type layer deposition followed by a partial formation of the intrinsic layer. In this case, 10 nm of the intrinsic layer are formed in the same chamber before performing a cleaning step. An in-situ NF$_3$ plasma cleaning step is performed in the same processing chamber. The NF$_3$ plasma cleaning step in this embodiment had a duration of about 30 seconds at low power (about 0.6 W/cm$^2$). In this way, the contaminants are contained in the partial intrinsic layer and can be removed during the cleaning step. The surface of the p-type layer could be treated without losing the thickness of the p-type layer due to etching. The cleaning step is followed by the formation of the remaining thickness of the intrinsic layer and the n-type layer. The plot 222 demonstrates an improvement in the FF to 70% and the $V_{oc}$ to 900 mV.

Figure 4:
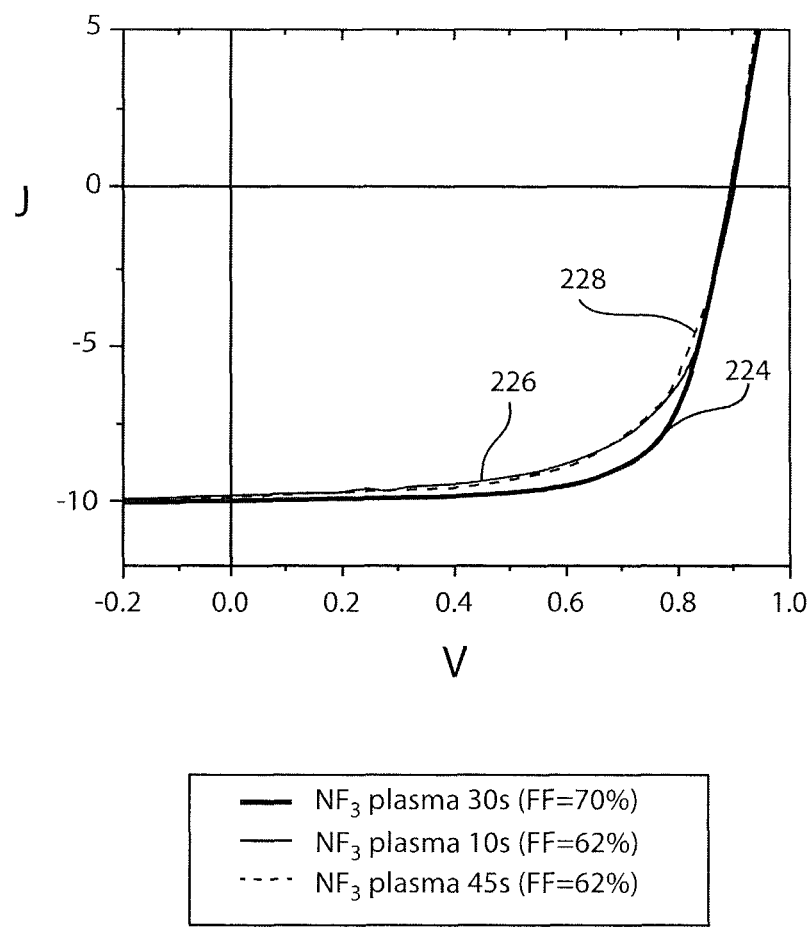
FIG. 4 depicts plots showing current density (J) (mA/cm$^2$) versus voltage (V) (volts) for photovoltaic devices with an in-situ $NF_3$ plasma treatment for 10 seconds, 30 seconds and 45 seconds in accordance with the present principles.

Referring to FIG. 4, plots of current density (J) (mA/cm$^2$) versus voltage (V) (volts) for devices with different durations for a NF$_3$ clean process are illustratively shown. Plot 224 shows a J-V curve corresponding to a 30 second NF$_3$ clean process with FF=70%. Plot 226 shows a J-V curve corresponding to a 10 second NF$_3$ clean process with FF=62%. Plot 228 shows a J-V curve corresponding to a 45 second NF$_3$ clean process with FF=62%. The plasma clean time can be adjusted for given conditions to reduce the duration needed to achieve clean conditions.

Figure 5:
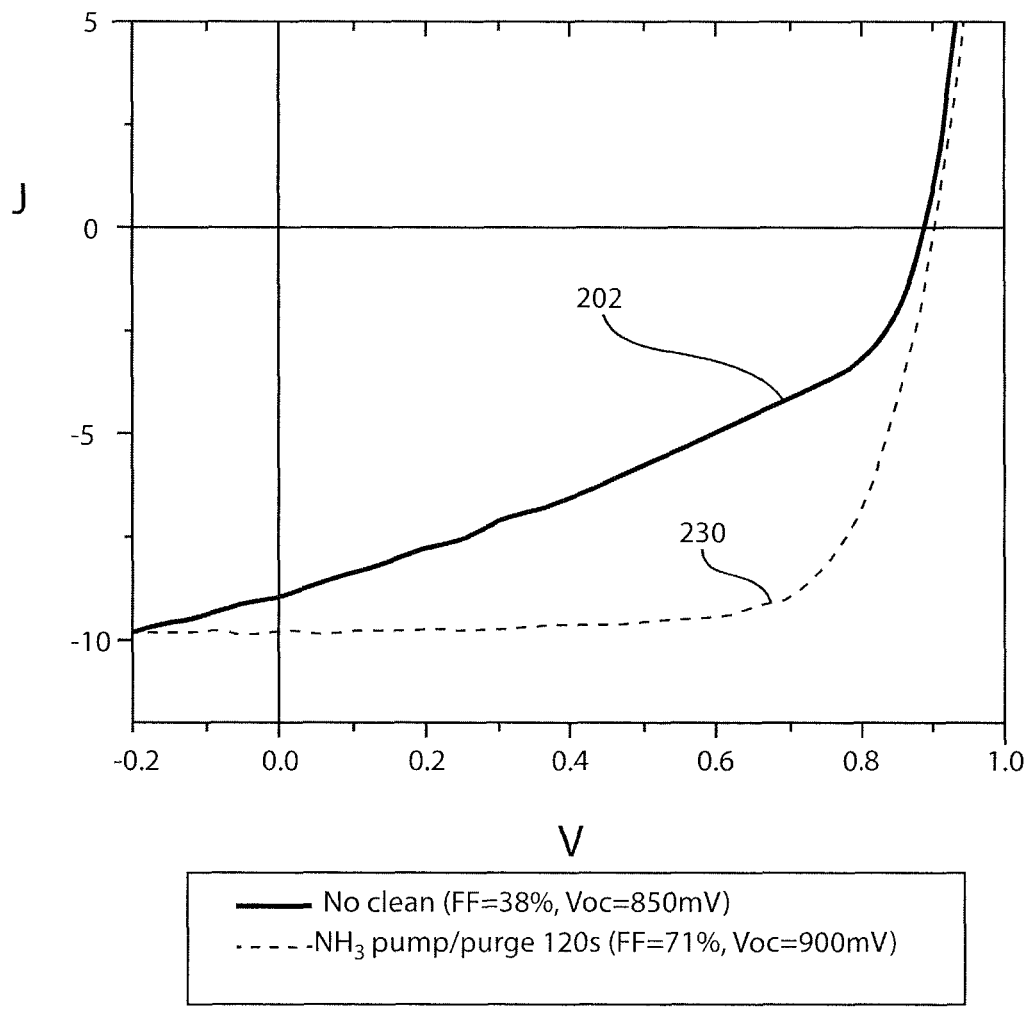
FIG. 5 depicts plots showing current density (J) (mA/cm$^2$) versus voltage (V) (volts) for photovoltaic devices with an ammonia purge for 120 seconds in accordance with the present principles.

Referring to FIG. 5, plots of current density (J) (mA/cm$^2$) versus voltage (V) (volts) for devices with and without a clean process are illustratively shown. Plot 202 again shows the J-V curve as depicted in FIG. 2 with FF=38% and $V_{oc}$=850 mV for reference. Plot 230 shows a J-V curve for an amorphous Si device with a pin stack formed with the use of a NH$_3$ purge step between the p-type layer and the intrinsic layer. The process for forming the device of plot 230 includes p-type layer deposition followed by an in-situ NH$_3$ pump or purge step in the same processing chamber. The NH$_3$ pump or purge cleaning step in this embodiment had a duration of about 120 seconds. In this way, the contaminants on the surface of the p-type layer and in the chamber and lines could be removed without losing thickness of the p-type layer. The cleaning step is followed by the formation of the intrinsic layer and the n-type layer. The plot 230 demonstrates an improvement in the FF to 71% and the $V_{oc}$ to 900 mV.

Note that the characteristics of the devices plotted in FIGS. 2-5 have the p-type layer formed by using silane gas for a-Si (or a-SiC) formation, and using diborane gas for boron doping. Diborane gas is more likely to produce contaminates then trimethyl borane (TMB); however, diborane gas is much more inexpensive. The present principles are particularly effective when employing diborane gas since use of diborane gas is more economical. In addition, the formation of a pin stack for a photovoltaic device can be carried out in a single chamber process, eliminating the need to form the layers of the pin stack in different chambers.

Figure 6:
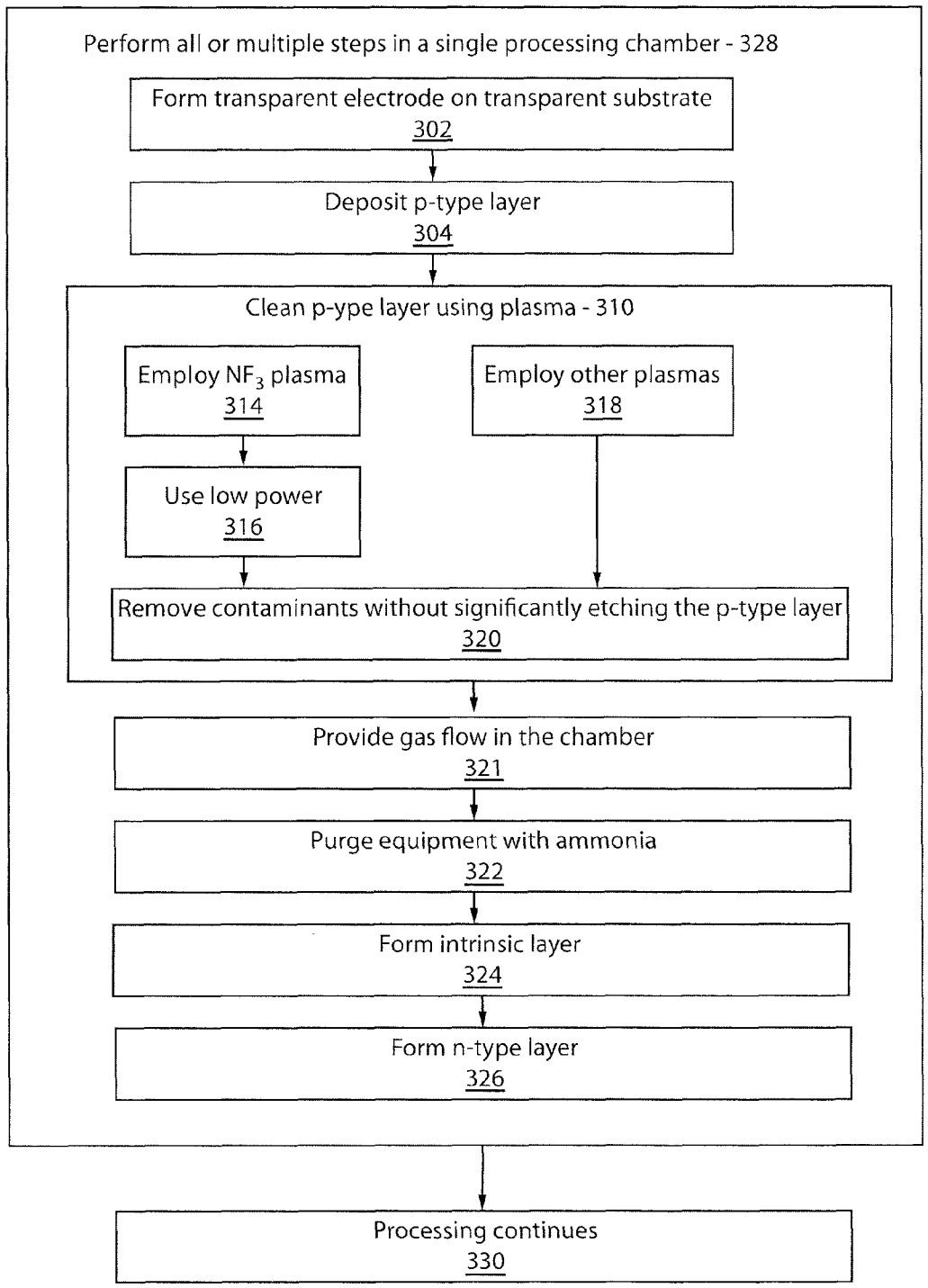
FIG. 6 is a block/flow diagram showing methods for fabricating a photovoltaic device in accordance with illustrative embodiments.

Referring to FIG. 6, a method for forming a photovoltaic device is shown in accordance with illustrative embodiments. It should also be noted that, in some alternative implementations, the functions noted in the blocks of FIGS. 6 and 7 may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In block 302, a transparent conductive electrode is formed on a transparent substrate. Other layers may also be provided and may be collectively referred to a substrate. In block 304, a p-type layer is deposited on the transparent conductive electrode or on the substrate. In one embodiment, the p-type layer includes silicon containing material (e.g., a-Si, a-SiC, etc.) doped with p-type dopants and in particular, boron. The p-type layer is preferably deposited using, e.g., silane and doped with boron using diborane gas, although other processes may be employed.

In block 310, in one embodiment, the p-type layer is cleaned directly by exposing a surface of the p-type layer to a plasma treatment to react with contaminants. The plasma treatment may include one or more different plasmas. In block 314, the plasma treatment includes a nitrogen trifluoride plasma although other plasmas may be employed. In particularly useful embodiments, the plasma includes a fluorine-containing material. In block 316, the nitrogen trifluoride plasma is provided at a low power (e.g., about 0.6 W/cm$^2$ or less). In block 318, other fluorine-based gases may be employed for the plasma treatment or etch, for example, $CF_4$, $SF_4$, $SF_6$, etc. These plasmas are also administered using a low power or otherwise adjusted. In this way, cleaning the p-type layer includes removing contaminants from the p-type layer without significant etching of the p-type layer in block 320.

In addition to or instead of the plasma treatment, especially when diborane gas is employed to form dopants for the p-type layer, a gas flow or purge is performed in the processing chamber before forming the intrinsic layer to react with and purge contaminants, in particular boron species, from the chamber and equipment, in block 321. The gas flow may include fluorine-based gases such as, e.g., $NF_3$, $CF_4$, $SF_4$, $SF_6$, etc.

In addition to or instead of the plasma treatment and/or the gas flow, an ammonia purge is performed in the processing chamber before forming the intrinsic layer to react with and purge contaminants, in particular boron species, from the chamber and equipment, in block 322.

The gas flow process refers to exposing the work sample or device to a flowing gas. The purge process includes purging the equipment including the chamber, lines, etc. Depending on the equipment, the gas flow and purge processes may be the same, and the gases and processes employed in these processes may be employed interchangeably. In addition, the gas flow and purge process may be performed concurrently and the gases thereof may be mixed together.

The combination of process steps may be adjusted to find a beneficial combination of plasma, flow and purge processes. For example, $NH_3$ flow and a $NF_3$ plasma cleaning may be performed concurrently, or the $NF_3$ plasma may be performed with a $NF_3$ flow. Other combinations are contemplated.

In block 324, an intrinsic layer is formed on the p-type layer. In block 326, an n-type layer is formed on the intrinsic layer. In block 328, the processing steps including the formation of the p, i and n type layers are preferably performed in a single processing chamber, and in particular, a radio frequency (RF) excitation processing chamber. The single chamber processing means that the device or sample is not removed between depositions and/or cleaning sequences. Although it is preferable that all steps be performed in the same chamber, there is still some benefit gained by having at least a subset of the steps being performed together in the same chamber. For example, depositing the p-type layer and the cleaning step may be performed in a same processing chamber. In addition, the intrinsic layer and the n-type layer may be formed in the same processing chamber as the p-type layer. In block 330, processing continues to form other layers (e.g., a back-reflector, etc.), other structures, etc. and to complete the fabrication of the device(s).

Figure 7:
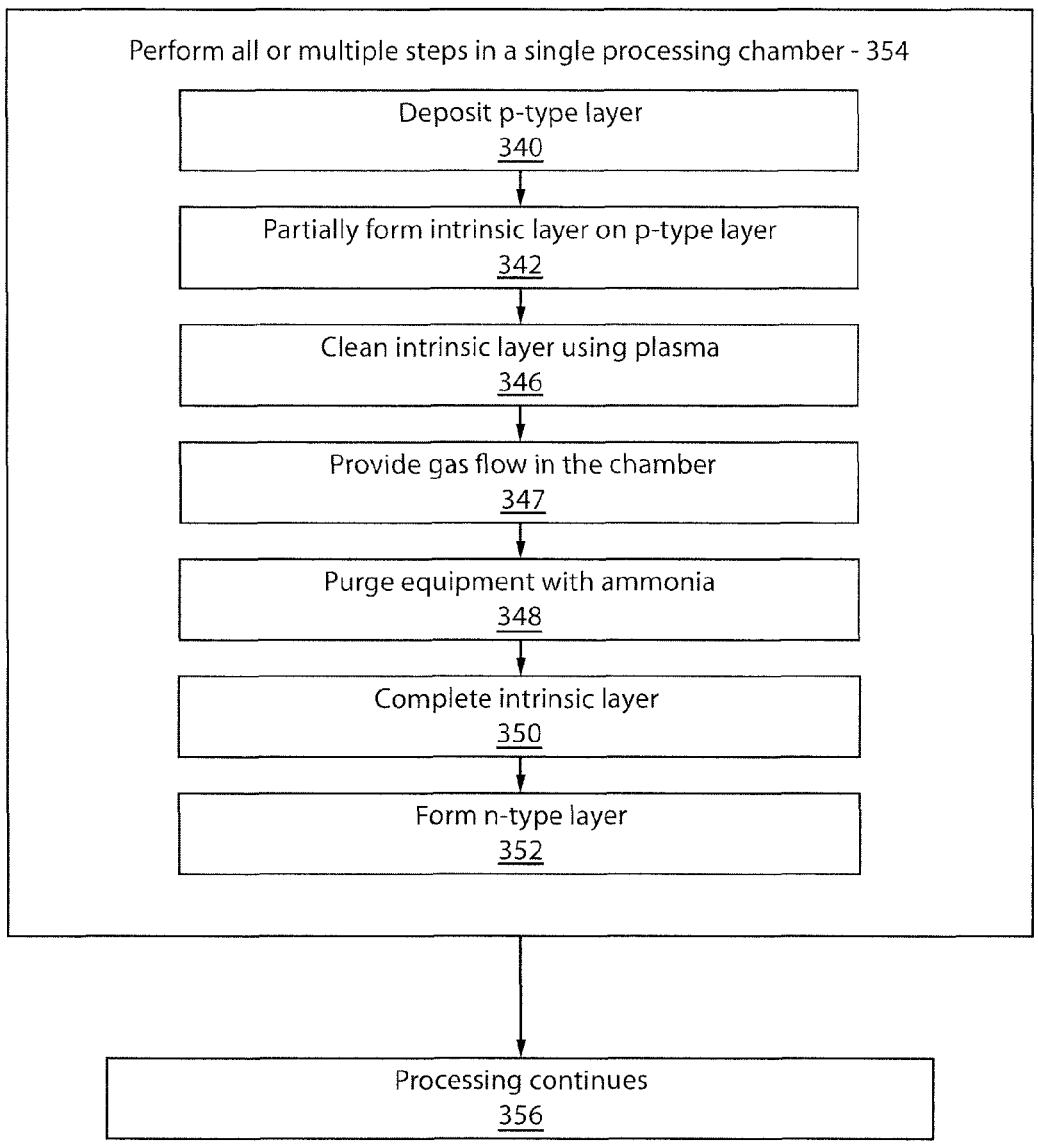
FIG. 7 is a block/flow diagram showing methods for fabricating a photovoltaic device using a plasma-treated partially-formed intrinsic layer in accordance with illustrative embodiments.

Referring to FIG. 7, another method for forming a photovoltaic device is illustratively shown. In block 340, a p-type layer is formed on a substrate as described above. In block 342, an intrinsic layer is partially formed on the p-type layer.

In block 346, a partially formed intrinsic layer is cleaned by exposing a surface of the partially formed intrinsic layer to a plasma treatment to react with contaminants. The plasma treatment is as described above, in particular, with reference to block 310 of FIG. 6. The partially formed intrinsic layer may include a thickness of between about 5 nm and about 20 nm.

In addition to or instead of the plasma treatment, a gas flow or purge is performed in the processing chamber before forming the intrinsic layer to react with and purge contaminants, in particular boron species, from the chamber and equipment, in block 347. The gas flow may include fluorine-based gases such as, e.g., $NF_3$, $CF_4$, $SF_4$, $SF_6$, etc.

In addition to or instead of the plasma treatment and/or the gas flow, an ammonia purge is performed in the processing chamber before completing the intrinsic layer to react with and purge contaminants, in particular boron species, from the chamber and equipment, in block 348.

In block 350, the intrinsic layer is completed by continuing to deposit the material (e.g., a-Si:H) on the p-type layer. In block 352, an n-type layer is formed on the intrinsic layer. In block 354, the processing steps including the formation of the p, i and n type layers are preferably performed in a single processing chamber, as described above. This includes all or multiple processes being performed sequentially in a same chamber without removing the sample or device. In block 356, processing continues to form other layers (e.g., a back-reflector, etc.), other structures, etc. and to complete the fabrication of the devices.

Having described preferred embodiments of a solar cell made using diborane in a single processing chamber (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a photovoltaic device, comprising:
   depositing a p-type layer on a substrate;
   cleaning the p-type layer by at least one of exposing a surface of the p-type layer to a plasma treatment to react with contaminants;
   forming an intrinsic layer on the p-type layer; and
   forming an n-type layer on the intrinsic layer,
   wherein the plasma treatment includes a fluorine-based gas.

2. The method as recited in claim 1, wherein the steps of depositing the p-type layer and cleaning are performed in a same processing chamber.

3. The method as recited in claim 2, wherein the steps of forming the intrinsic layer and forming the n-type layer are performed in the same processing chamber as depositing the p-type layer.

4. The method as recited in claim 1, further comprising flowing gas through the chamber to react with contaminants.

5. The method as recited in claim 1, wherein the fluorine-based gas includes nitrogen trifluoride plasma provided at a power of about 0.6 W/cm$^2$ or less.

6. The method as recited in claim 1, wherein cleaning the p-type layer includes removing contaminants from the p-type layer without damaging the p-type layer.

7. The method as recited in claim 1, wherein depositing the p-type layer includes employing diborance gas to form dopants for the p-type layer and the method further comprises performing an ammonia purge of the processing chamber before forming the intrinsic layer.

8. A method for forming a photovoltaic device, comprising:
depositing a p-type layer on a substrate;
partially forming an intrinsic layer on the p-type layer;
cleaning a partially formed intrinsic layer by exposing a surface of the partially formed intrinsic layer to a plasma treatment to react with contaminants;
completing the intrinsic layer on the p-type layer; and
forming an n-type layer on the intrinsic layer,
wherein the plasma treatment includes fluorine-based plasma.

9. The method as recited in claim 8, wherein the steps of depositing the p-type layer and the cleaning are performed in a same processing chamber.

10. The method as recited in claim 9, wherein the steps of partially forming the intrinsic layer, completing the intrinsic layer and forming the n-type layer are performed in the same processing chamber as depositing the p-type layer.

11. The method as recited in claim 8, further comprising flowing gas through the chamber to react with contaminants.

12. The method as recited in claim 8, wherein the fluorine-based plasma includes nitrogen trifluoride plasma provided at a power of about 0.6 W/cm$^2$ or less.

13. The method as recited in claim 8, wherein depositing the p-type layer includes employing diborance gas to form dopants for the p-type layer and the method further comprises performing an ammonia purge of the processing chamber before completing the intrinsic layer.

14. The method as recited in claim 8, wherein the partially formed intrinsic layer includes a thickness of between about 5 nm and about 20 nm.

15. A method for forming a photovoltaic device, comprising:
depositing a p-type layer on a substrate using diborane as a dopant gas;
cleaning the p-type layer by a plasma treatment to react with and remove contaminants;
completing an intrinsic layer on the p-type layer; and
forming an n-type layer on the intrinsic layer, wherein all steps are performed in a single processing chamber,
wherein the plasma treatment includes fluorine-based plasma.

16. The method as recited in claim 15, further comprising flowing gas through the chamber to react with contaminants.

17. The method as recited in claim 15, wherein the fluorine-based plasma includes nitrogen trifluoride plasma provided at a power of about 0.6 W/cm$^2$ or less.

18. The method as recited in claim 15, wherein cleaning the p-type layer includes removing contaminants from the p-type layer without significant etching of the p-type layer.

19. The method as recited in claim 15, further comprising performing an ammonia purge of the processing chamber before forming the intrinsic layer.

20. The method as recited in claim 15, further comprising partially forming the intrinsic layer on the p-type layer before the cleaning step.

* * * * *